US012765327B2

(12) United States Patent
Nakata

(10) Patent No.: US 12,765,327 B2
(45) Date of Patent: Oct. 13, 2026

(54) METHOD FOR MANUFACTURING SEMICONDUCTOR DEVICE AND METHOD FOR MANUFACTURING POWER CONTROL CIRCUIT

(71) Applicant: Mitsubishi Electric Corporation, Tokyo (JP)

(72) Inventor: Yosuke Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 137 days.

(21) Appl. No.: 17/198,623

(22) Filed: Mar. 11, 2021

(65) Prior Publication Data

US 2021/0366788 A1 Nov. 25, 2021

(30) Foreign Application Priority Data

May 19, 2020 (JP) ................................ 2020-087244

(51) Int. Cl.
*H10P 74/20* (2026.01)
*H10W 72/00* (2026.01)
(Continued)

(52) U.S. Cl.
CPC ........... *H10P 74/207* (2026.01); *H10W 74/01* (2026.01); *H10W 90/00* (2026.01); *H10W 72/07331* (2026.01); *H10W 72/07531* (2026.01)

(58) Field of Classification Search
None
See application file for complete search history.

(56) References Cited

U.S. PATENT DOCUMENTS

| | | | | |
|---|---|---|---|---|
| 7,915,720 B2 * | 3/2011 | Tashiro | .................. | H01L 24/29 257/737 |
| 8,253,233 B2 * | 8/2012 | Guth | ...................... | H01L 24/29 257/691 |

(Continued)

FOREIGN PATENT DOCUMENTS

| | | | |
|---|---|---|---|
| JP | 2015056550 A * | 3/2015 | ............ H01L 24/75 |
| JP | 2016-100424 A | 5/2016 | |

(Continued)

OTHER PUBLICATIONS

Hironori Itoh et.al., "High Reliable 4H-SiC Epitaxial Wafer with BPD Free Recombination-Enhanced Buffer Layer for High Current Applications", ICSCRM, 2019.

(Continued)

*Primary Examiner* — Telly D Green
(74) *Attorney, Agent, or Firm* — Studebaker Brackett PLLC

(57) ABSTRACT

In a method for manufacturing a semiconductor device, a back surface of each of plurality of current-carrying semiconductor elements each having a plurality of P-N junction diodes built-in is connected to a first principal surface of a conductor plate. Further, a conductor piece is connected to a front surface of each of the plurality of current-carrying semiconductor elements. Then, a current-carrying test is conducted on the plurality of P-N junction diodes with a second principal surface of the conductor plate exposed on a bottom surface of an intermediate product of a semiconductor device including the plurality of current-carrying semiconductor elements, the conductor plate, and the conductor piece.

16 Claims, 8 Drawing Sheets

(51) Int. Cl.
*H10W 74/01* (2026.01)
*H10W 90/00* (2026.01)

(56) References Cited

U.S. PATENT DOCUMENTS

| | | | | |
|---|---|---|---|---|
| 9,874,596 | B2 | 1/2018 | Watanabe et al. | |
| 11,270,982 | B2* | 3/2022 | Sakai | B23K 1/00 |
| 2007/0170535 | A1* | 7/2007 | de Rochemont | C23C 18/1212 257/434 |
| 2011/0156229 | A1* | 6/2011 | Shinohara | H01L 23/49575 257/676 |
| 2011/0267781 | A1* | 11/2011 | Takayanagi | H01L 23/3735 361/720 |
| 2014/0264800 | A1* | 9/2014 | Gowda | H01L 23/4952 438/122 |
| 2015/0130085 | A1* | 5/2015 | Hino | H01L 24/29 257/782 |
| 2016/0126205 | A1* | 5/2016 | Kadoguchi | H01L 23/49582 438/107 |
| 2016/0322327 | A1* | 11/2016 | Hino | H01L 23/053 |
| 2017/0033710 | A1* | 2/2017 | Muto | H01L 27/0664 |
| 2019/0198495 | A1* | 6/2019 | Fujita | H01L 27/0207 |
| 2019/0348404 | A1* | 11/2019 | Sakai | H05K 3/34 |
| 2020/0144209 | A1 | 5/2020 | Aketa | |
| 2021/0167005 | A1 | 6/2021 | Nakata | |
| 2021/0398950 | A1* | 12/2021 | Nakata | H01L 25/18 |
| 2022/0115342 | A1 | 4/2022 | Aketa | |
| 2022/0139797 | A1* | 5/2022 | Takahashi | H01L 23/36 257/712 |

FOREIGN PATENT DOCUMENTS

| | | | | | |
|---|---|---|---|---|---|
| JP | 6104363 | B2 | | 3/2017 | |
| JP | 2017117869 | A | * | 6/2017 | |
| JP | 6289287 | B2 | | 3/2018 | |
| JP | 2018107364 | A | * | 7/2018 | H01L 21/4825 |
| JP | 2019021740 | A | * | 2/2019 | |
| WO | WO-2018138902 | A1 | * | 8/2018 | B23K 1/00 |
| WO | 2018/198990 | A1 | | 11/2018 | |
| WO | 2019/202687 | A1 | | 10/2019 | |
| WO | WO-2020110170 | A1 | * | 6/2020 | H01L 23/142 |
| WO | WO-2020170650 | A1 | * | 8/2020 | H01L 23/3672 |

OTHER PUBLICATIONS

An Office Action; "Notice of Reasons for Refusal," mailed by the Japanese Patent Office on Oct. 4, 2022, which corresponds to Japanese Patent Application No. 2020-087244 and is related to U.S. Appl. No. 17/198,623; with English language translation.

An Office Action; "Notice of Reasons for Refusal," mailed by the Japanese Patent Office on Feb. 7, 2023, which corresponds to Japanese Patent Application No. 2020-087244 and is related to U.S. Appl. No. 17/198,623; with English language translation.

An Office Action mailed by China National Intellectual Property Administration on Jul. 13, 2023, which corresponds to Chinese Patent Application No. 202110528910.7 and is related to U.S. Appl. No. 17/198,623; with English language translation.

* cited by examiner

METHOD FOR MANUFACTURING SEMICONDUCTOR DEVICE AND METHOD FOR MANUFACTURING POWER CONTROL CIRCUIT

BACKGROUND OF THE INVENTION

Field of the Invention

The present disclosure relates to a method for manufacturing a semiconductor device and a method for manufacturing a power control circuit.

Description of the Background Art

Japanese Patent No. 6104363 discloses a test apparatus for conducting a current-carrying test on a P-N junction diode incorporated in a semiconductor element and a test condition for the current-carrying test. The semiconductor element is a metal-oxide-semiconductor field-effect transistor (MOSFET), or the like, using silicon carbide (SiC), and the P-N junction diode is subjected to current application.

In a case where forward current is applied to a MOSFET using SiC, bipolar degradation may occur in which forward voltage increases with expanding lamination defects. In order to reduce the bipolar degradation, a buffer layer is formed on a substrate, and a drift layer is formed on the buffer layer, so that bipolar current does not reach a lamination defect in the substrate.

"High Reliable 4H-SiC Epitaxial Wafer with BPD Free Recombination-Enhanced Buffer Layer for High Current Applications", Hironori Itoh et. al., ICSCRM, 2019 discloses a method for setting density of a lamination defect included in a buffer layer significantly smaller than density of a lamination defect included in a substrate.

However, in order to reduce occurrence of bipolar degradation in the market, it is desirable to identify a semiconductor element including a lamination defect in a buffer layer with a current-carrying test and prevent an outflow of the semiconductor element to the market. Meanwhile, a necessary and sufficient condition for a current-carrying test varies depending on a use condition, such as current density or maximum bonding temperature, of a semiconductor element. However, in order to ensure impossibility of growth of a lamination defect in the buffer layer during lifetime of the semiconductor element, a high temperature, long time, or high current-density current-carrying test may be required.

Further, Japanese Patent No. 6289287 discloses a current-carrying test conducted chip by chip by using laminated metal foil for an increase in current density in a current-carrying test.

In a case where a current-carrying test has been conducted as disclosed in Japanese Patent No. 6104363, degradation of an electrode included in a semiconductor element is required to be reduced in order to incorporate the semiconductor element into a semiconductor device after the current-carrying test. Therefore, test temperature when a current-carrying test is conducted is required be limited to 230° C. or lower. By setting test temperature high, it is possible to reduce current application time when a current-carrying test is conducted. However, the current application time is required to be set in units of minutes when the current-carrying test is actually conducted, because the test temperature is limited due to a restriction of a process after the current-carrying test. Further, in a case where a current-carrying test is conducted on a semiconductor element through which current having large current density flows, a condition for the current-carrying test is required to be strict. Therefore, longer current application time is required. In addition, depending on a specification of electrodes included in the semiconductor element or on how the electrodes are mounted, a screening test is required to be conducted at a lower temperature. Therefore, longer current application time is required. In addition, because the current-carrying test is conducted chip by chip, more test apparatuses are required to be subjected to the current-carrying test. Further, because a current-carrying test of a semiconductor element itself is conducted, a transport system for transporting the semiconductor element, a probe jig for conducting the current-carrying test, or the like, is required to be precise. As a result, costs for the test apparatuses increase. These problems reduce productivity of semiconductor devices.

In a case where a current-carrying test is conducted chip by chip by using laminated metal foil as disclosed in Japanese Patent No. 6289287, the laminated metal foil is required to be replaced every time current is applied. Therefore, an indirect member cost of the laminated metal foil increases. In addition, an operating rate of the test apparatus subjected to the current-carrying test decreases. These problems raise costs for semiconductor devices.

It is also conceivable that a current-carrying test is conducted on a semiconductor device including a plurality of modularized semiconductor elements. However, a lamination defect is more likely to be included and a defective rate may rise in a case where a current-carrying test is conducted on the semiconductor device, as compared with a case where the current-carrying test is conducted on a single non-modularized semiconductor element. In addition, a larger test apparatus to be subjected to the current-carrying test may be required. Further, heat resistant temperature of a peripheral member other than the semiconductor element may restrict test temperature for when the current-carrying test is conducted. Further, heat generated by the semiconductor element during the current-carrying test may be trapped inside the semiconductor device, raising temperature inside the semiconductor device. Further, in a case where a plurality of semiconductor elements is electrically connected in parallel, test current may unevenly flow into a specific semiconductor element having a low forward characteristic, and excessive current may flow into the specific semiconductor element due to an effect of a difference in forward characteristics of a plurality of P-N junction diodes incorporated in the respective plurality of semiconductor elements. These problems reduce productivity of semiconductor devices.

The present disclosure has been made to solve the above-mentioned problems.

SUMMARY

An object of the present disclosure is to, in a case where a P-N junction diode current-carrying test is conducted on a semiconductor device, improve productivity of a semiconductor device, reduce a cost for the semiconductor device, and reduce an increase in temperature of a current-carrying semiconductor element in the current-carrying test.

In a method for manufacturing a semiconductor device according to the present disclosure, a back surface of each of a plurality of current-carrying semiconductor elements each having a plurality of P-N junction diodes built-in is connected to a first principal surface of a conductor plate. Further, a conductor piece is connected to a front surface of each of the plurality of current-carrying semiconductor elements. Then, a current-carrying test is conducted on the plurality of P-N junction diodes with a second principal surface of the conductor plate exposed on a bottom surface of an intermediate product of a semiconductor device including the plurality of current-carrying semiconductor elements, the conductor plate, and the conductor piece.

According to the present disclosure, a current-carrying test is conducted on a plurality of P-N junction diodes with the P-N junction diodes included in an intermediate product of a semiconductor device. Therefore, a screening test for a plurality of current-carrying semiconductor elements can be conducted simultaneously. As a result, productivity of a semiconductor device can be improved.

Further, according to the present disclosure, a test probe used for a current-carrying test can be applied to a conductor piece. Therefore, it is possible to reduce damage by the test probe to a surface electrode of a current-carrying semiconductor element. In addition, the conductor piece can be utilized as metal film for electrode bonding in a later assembly process. As a result, a cushioning material such as metal foil for protecting the surface electrode of the current-carrying semiconductor element is unnecessary, by which a cost for the semiconductor device can be reduced.

Further, according to the present disclosure, heat generated by a current-carrying semiconductor element in a current-carrying test is absorbed by the conductor plate, and is effectively released from a second principal surface of the conductor plate exposed on a bottom surface of an intermediate product to a test stage, or the like. As a result, it is possible to reduce an increase in temperature of the current-carrying semiconductor element in the current-carrying test.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

1 First Preferred Embodiment

1.1 Method for Manufacturing Semiconductor Device

Figure 1:
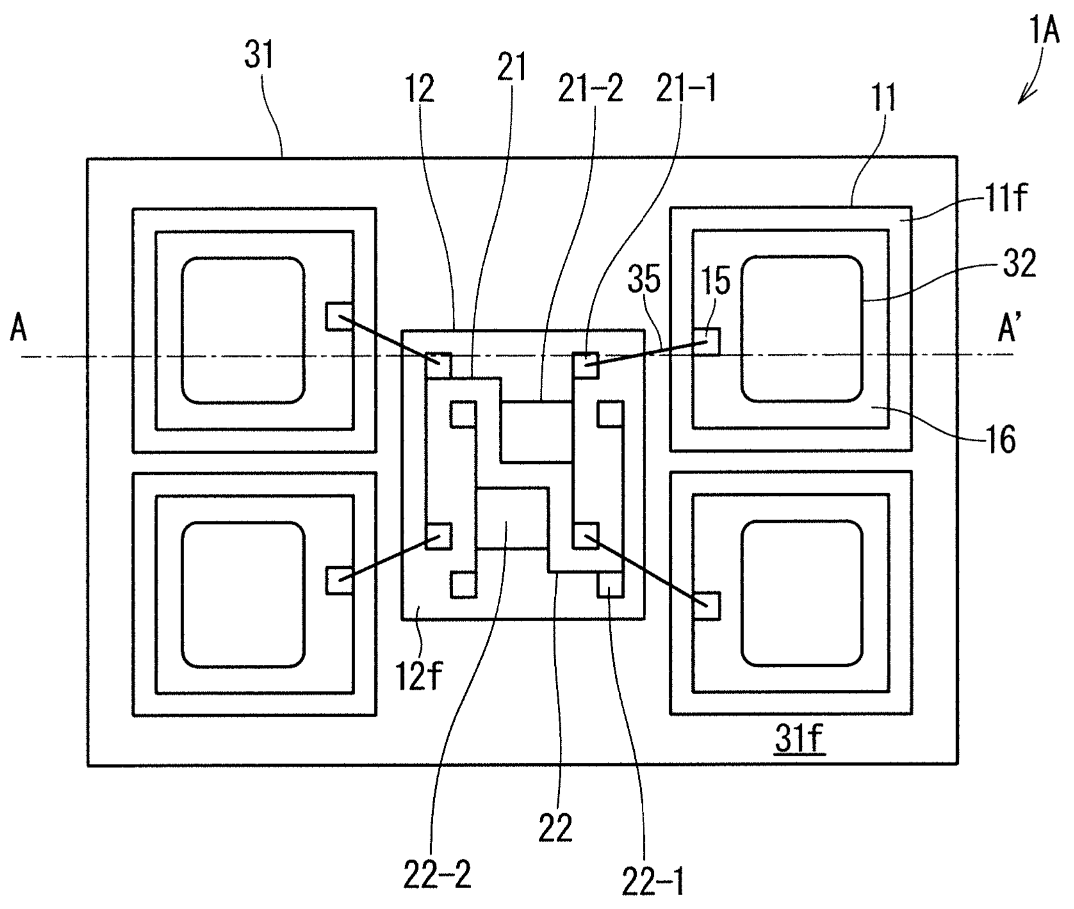
FIG. 1 is a plan view schematically illustrating a first intermediate product of a semiconductor device manufactured by a method for manufacturing a semiconductor device according to a first preferred embodiment.
Figure 2:
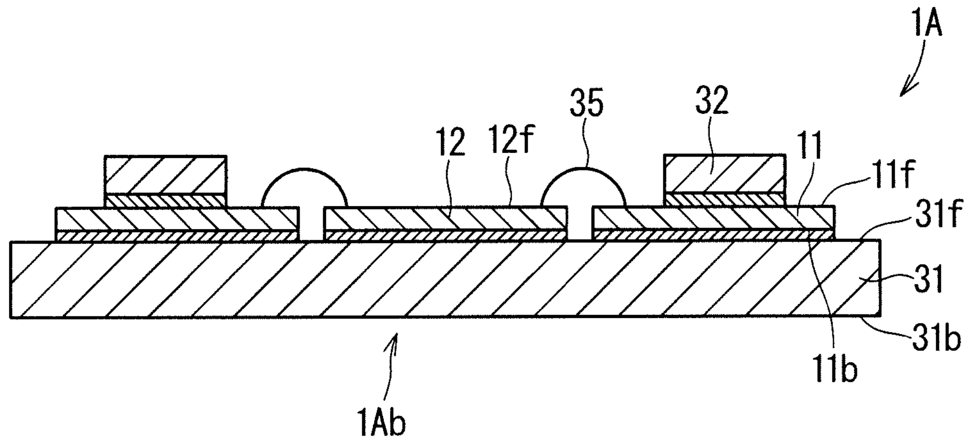
FIG. 2 is a cross-sectional view schematically illustrating the first intermediate product of the semiconductor device manufactured by the method for manufacturing a semiconductor device according to the first preferred embodiment.
Figure 3:
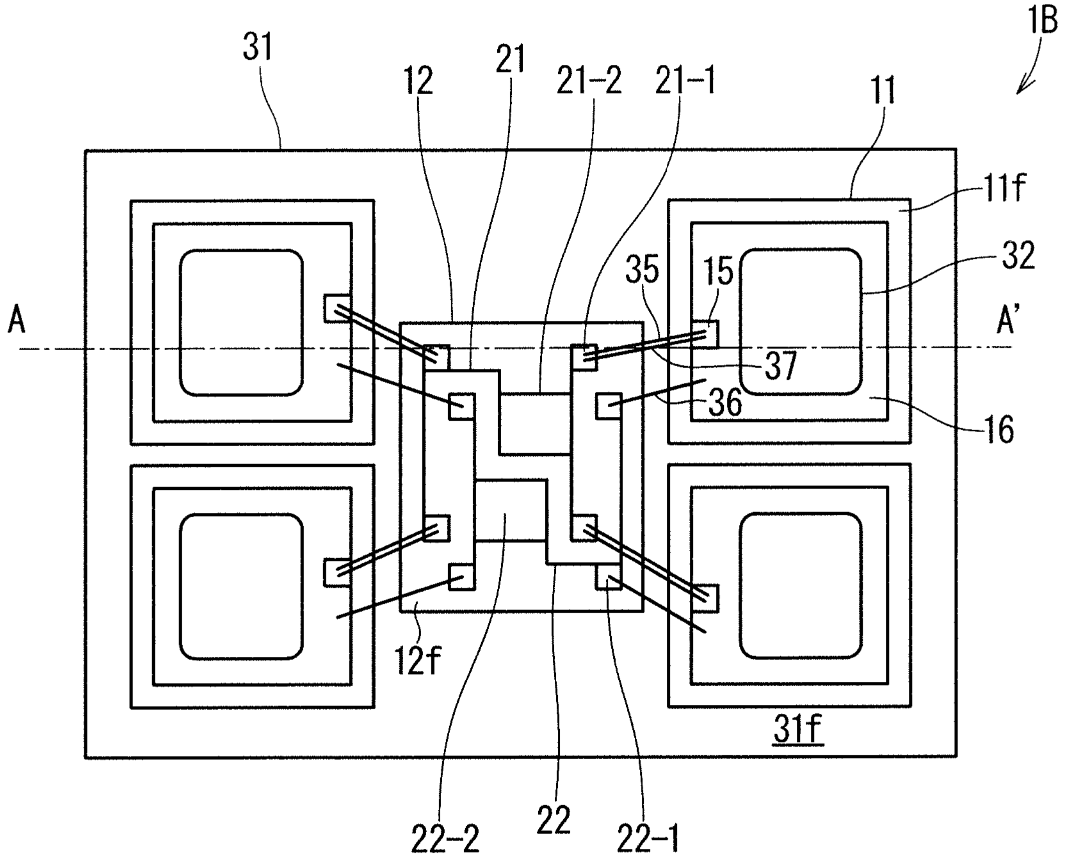
FIG. 3 is a plan view schematically illustrating a second intermediate product of the semiconductor device manufactured by the method for manufacturing a semiconductor device according to a first preferred embodiment.
Figure 4:
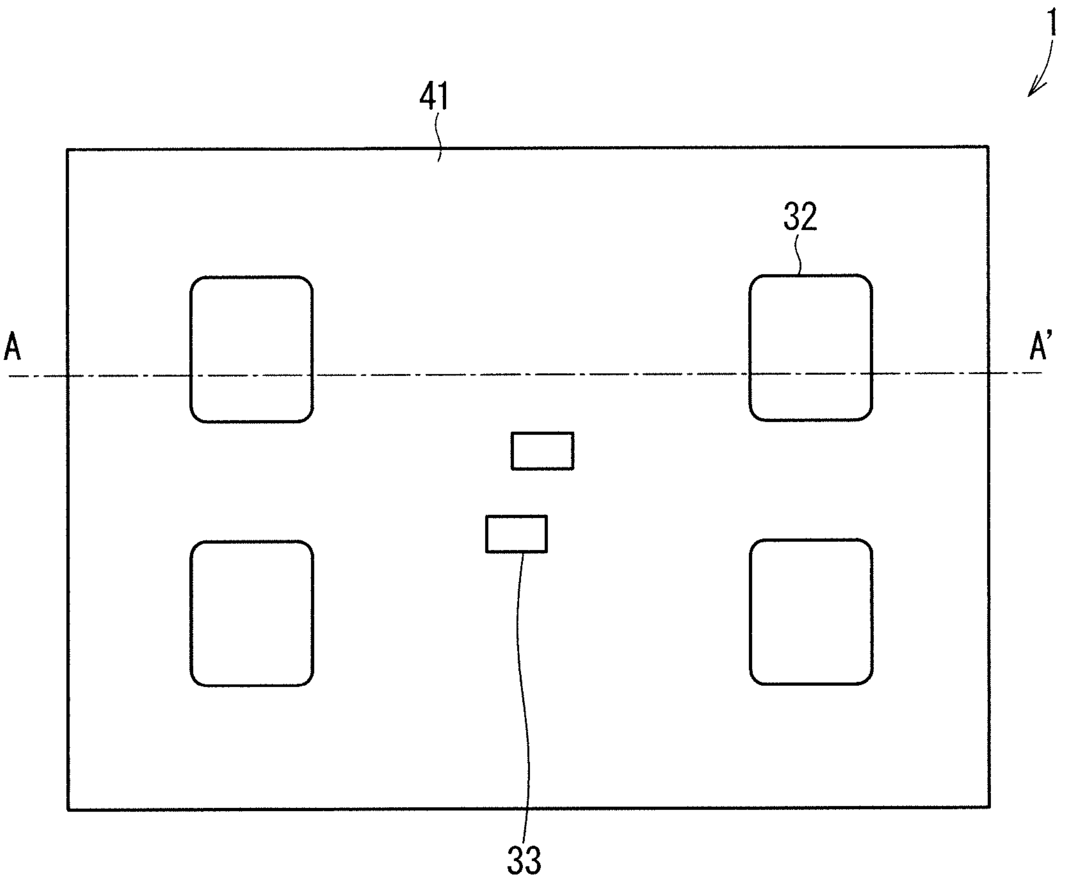
FIG. 4 is a plan view schematically illustrating the semiconductor device manufactured by the method for manufacturing a semiconductor device according to the first preferred embodiment.
Figure 5:
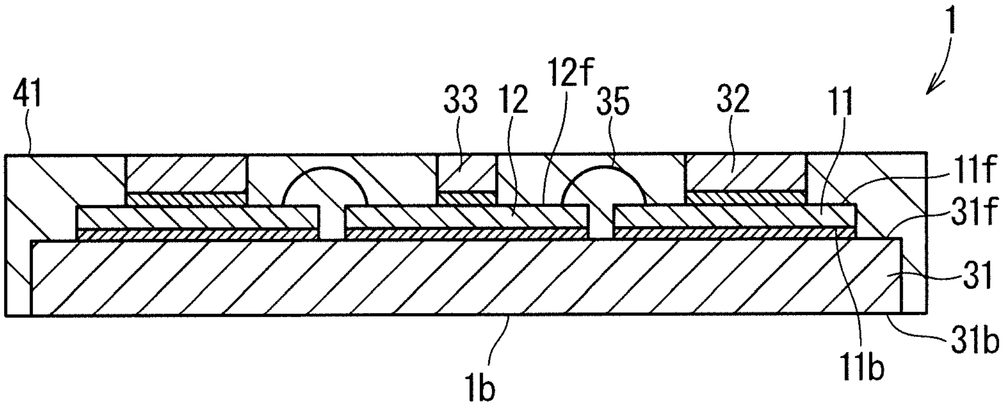
FIG. 5 is a cross-sectional view schematically illustrating the semiconductor device manufactured by the method for manufacturing a semiconductor device according to the first preferred embodiment.

FIGS. 1 and 2 are a plan view and a cross-sectional view, respectively, schematically illustrating a first intermediate product of a semiconductor device manufactured by a method for manufacturing a semiconductor device according to a first preferred embodiment. FIG. 3 is a plan view schematically illustrating a second intermediate product of the semiconductor device manufactured by the method for manufacturing a semiconductor device according to the first preferred embodiment. FIGS. 4 and 5 are a plan view and a cross-sectional view, respectively, schematically illustrating the semiconductor device manufactured by the method for manufacturing a semiconductor device according to the first preferred embodiment. FIGS. 2 and 5 illustrate cross sections taken along a line A-A' drawn in FIGS. 1 and 4, respectively.

Figure 6:
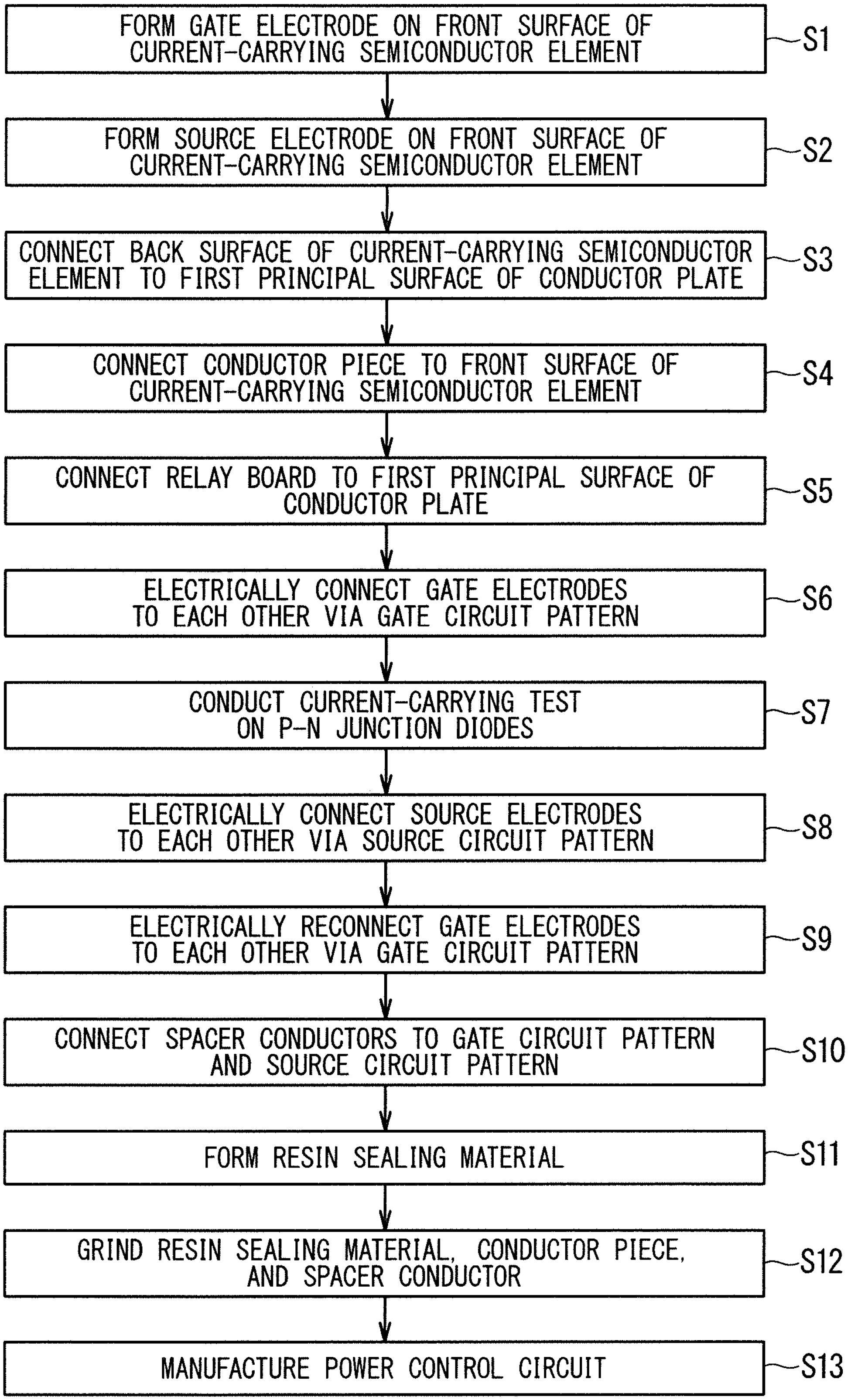
FIG. 6 is a flowchart illustrating a method for manufacturing a semiconductor device and method for manufacturing a power control circuit according to the first preferred embodiment.

FIG. 6 is a flowchart illustrating a method for manufacturing a semiconductor device and method for manufacturing a power control circuit according to the first preferred embodiment.

A method for manufacturing a semiconductor device according to the first preferred embodiment includes steps S1 to S12 illustrated in FIG. 6.

A semiconductor device 1 manufactured by the method for manufacturing a semiconductor device according to the first preferred embodiment, which is illustrated in FIGS. 4 and 5, is a power semiconductor device, and is a metal-oxide-semiconductor field-effect transistor (MOSFET) using SiC. The semiconductor device 1 may be a semiconductor device other than a MOSFET using SiC.

In step S1, as illustrated in FIGS. 1 and 2, each of two or more gate electrodes 15 is formed on a front surface 11*f* of each of two or more current-carrying semiconductor elements 11 included in a plurality of current-carrying semiconductor elements 11. In the first preferred embodiment, the two or more current-carrying semiconductor elements 11 are all of the plurality of current-carrying semiconductor elements 11. Each of the plurality of current-carrying semiconductor elements 11 has a plurality of P-N junction diodes built-in. Current is applied to the plurality of P-N junction diodes.

In step S2, as illustrated in FIGS. 1 and 2, each of two or more source electrodes 16 is formed on a front surface 11*f* of each of the two or more current-carrying semiconductor elements 11 included in the plurality of current-carrying semiconductor elements 11. In the first preferred embodiment, the two or more current-carrying semiconductor elements 11 are all of the plurality of current-carrying semiconductor elements 11.

Steps S1 and S2 may or may not be performed simultaneously. Steps S1 and S2 may be performed in any order.

In step S3, as illustrated in FIGS. 1 and 2, a back surface 11*b* of each of the plurality of current-carrying semiconductor elements 11 is connected to a first principal surface 31*f* of a conductor plate 31. In the first preferred embodiment, the first principal surface 31*f* of the conductor plate 31 is a front surface of the conductor plate 31. In the first preferred embodiment, the back surface 11*b* of each of the plurality of current-carrying semiconductor elements 11 is connected to the first principal surface 31*f* of the conductor plate 31 by sinter bonding. Thus, the back surface 11*b* of each of the plurality of current-carrying semiconductor elements 11 is electrically and thermally connected to the first principal surface 31*f* of the conductor plate 31.

In step S4, as illustrated in FIGS. 1 and 2, a conductor piece 32 is connected to a front surface 11*f* of each of the plurality of current-carrying semiconductor elements 11. In the first preferred embodiment, a conductor piece 32 is each of a plurality of conductor pieces connected to a front surface 11*f* of each of the plurality of current-carrying semiconductor elements 11. In the first preferred embodiment, a plurality of conductor pieces 32 is independent of each other. In the first preferred embodiment, a conductor piece 32 is connected by sinter bonding to a front surface 11*f* of each of the plurality of current-carrying semiconductor elements 11. Thus, a conductor piece 32 is electrically and thermally connected to a front surface 11*f* of each of the plurality of current-carrying semiconductor elements 11. In the first preferred embodiment, each of two or more conductor pieces 32 included in the plurality of conductor pieces 32 is connected via each of the two or more source electrodes 16 to a front surface 11*f* of the two or more current-carrying semiconductor elements 11.

In step S5, as illustrated in FIGS. 1 and 2, a relay board 12 is connected to the first principal surface 31*f* of the conductor plate 31. In the first preferred embodiment, the relay board 12 is connected to the first principal surface 31*f* of the conductor plate 31 by sinter bonding. Thus, the relay board 12 is thermally connected to the first principal surface 31*f* of the conductor plate 31. In the first preferred embodiment, the relay board 12 is one relay board. The relay board 12 may be a plurality of relay boards. The relay board 12 includes a gate circuit pattern 21 and a source circuit pattern 22. The gate circuit pattern 21 and the source circuit pattern 22 have conductivity. The gate circuit pattern 21 and the source circuit pattern 22 are arranged on a side of a front surface 12*f* of the relay board 12. The gate circuit pattern 21 includes two or more first gate pads 21-1 and a second gate pad 21-2. In the first preferred embodiment, the second gate pad 21-2 is one second gate pad. The second gate pad 21-2 may be a plurality of second gate pads. The second gate pad 21-2 is mainly used for inputting a signal to a first intermediate product 1A of the semiconductor device 1 when a current-carrying test is conducted on the first intermediate product 1A of the semiconductor device 1 illustrated in FIGS. 1 and 2, and for taking out a signal potential from the semiconductor device 1 in a case where the semiconductor device 1 is incorporated in a semiconductor device having a large circuit configuration. The source circuit pattern 22 includes two or more first source pads 22-1 and a second source pad 22-2. In the first preferred embodiment, the second source pad 22-2 is one second source pad. The second source pad 22-2 may be a plurality of second source pads.

A sinter bonding material used for sinter bonding performed in steps S3, S4 and S5 is a material including Ag, Cu, or the like. The sinter bonding is performed through a pressure bonding process or a pressure-free bonding process.

Steps S3, S4 and S5 may or may not be performed simultaneously. Steps S3, S4, and S5 may be performed in any order.

In step S6, as illustrated in FIGS. 1 and 2, the two or more gate electrodes 15 are electrically connected to each other via the gate circuit pattern 21. Thus, a common gate potential is applied to the two or more gate electrodes. In the first preferred embodiment, each of the two or more gate electrodes is electrically connected to each of the two or more first gate pads 21-1 via each of two or more conductive wires 35, by which the two or more gate electrodes 15 are electrically connected to each other via the gate circuit pattern 21.

By performing steps S1 to S6, it is possible to obtain the first intermediate product 1A of the semiconductor device 1 including the plurality of current-carrying semiconductor elements 11, the relay board 12, the two or more gate electrodes 15, the two or more source electrodes 16, the conductor plate 31, the conductor piece 32, and the two or more conductive wires 35, which are illustrated in FIGS. 1 and 2. A second principal surface 31*b* of the conductor plate 31 is exposed on a bottom surface 1Ab of the first intermediate product 1A of the semiconductor device 1. In the first preferred embodiment, the second principal surface 31*b* of the conductor plate 31 is a back surface of the conductor plate 31.

In step S7, a current-carrying test is conducted on a plurality of P-N junction diodes included in the plurality of current-carrying semiconductor elements 11 of the first intermediate product 1A of the semiconductor device 1 with the second principal surface 31*b* of the conductor plate 31 exposed on the bottom surface 1Ab of the first intermediate product 1A of the semiconductor device 1. In a case where the current-carrying test is conducted on a semiconductor module, an insulation material is attached to the second principal surface 31*b* of the conductor plate 31.

When the current-carrying test is conducted, the second principal surface 31*b* of the conductor plate 31 is placed on a current application stage. Thus, a common drain potential is applied to the plurality of current-carrying semiconductor elements 11. Further, heat generated by the plurality of current-carrying semiconductor elements 11 can be released from the plurality of current-carrying semiconductor elements 11 via the conductor plate 31 and the current application stage. Moreover, heat for raising test temperature of the plurality of current-carrying semiconductor elements 11 when a current-carrying test is conducted can be flowed into the plurality of current-carrying semiconductor elements 11 via the current application stage and the conductor plate 31.

The second gate pad 21-2 is electrically probed when a current-carrying test is conducted. Thus, a common gate potential is applied to the two or more current-carrying semiconductor elements 11. In addition, two or more conductor pieces 32 are electrically probed. Thus, each of source potentials independent of each other is applied to each of the two or more current-carrying semiconductor elements 11. Each of source potentials independent of each other is applied to each of the two or more current-carrying semiconductor elements 11, because, as described above, each of the two or more conductor pieces 32 connected to each of the two or more source electrodes 16 is independent of each other, and each of the source potentials independent of each other is applied to each of the two or more source electrodes 16. Further, negative bias voltage is applied between a gate electrode 15 and source electrode 16 formed on each of the current-carrying semiconductor elements 11. The negative bias voltage is voltage at which source potential applied to the source electrode 16 is higher than gate potential applied to a gate electrode 15. Thus, a channel of each of the current-carrying semiconductor elements 11, which are MOSFETs, can be reliably closed. With this arrangement, most of test current flowing through each of the current-carrying semiconductor elements 11 when a current-carrying test of each of the current-carrying semiconductor elements 11 is conducted is bipolar current flowing through a P-N junction diode incorporated in each of the current-carrying semiconductor elements 11. Thus, an appropriate condition can be set for a screening test of each of the current-carrying semiconductor elements 11.

Further, when a current-carrying test is conducted, current is applied from a source electrode 16 formed on each of the current-carrying semiconductor elements 11 to a gate electrode 15 formed on each of the current-carrying semiconductor elements 11 with the above-described drain potential, gate potential, and source potential applied to each of the current-carrying semiconductor elements 11. Thus, a current-carrying test is conducted on each of the plurality of P-N junction diodes incorporated in the plurality of current-carrying semiconductor elements 11.

When a current-carrying test is conducted, for example, a current value of test current flowing through each of the current-carrying semiconductor elements 11 is adjusted by a constant current source that supplies the test current to each of the current-carrying semiconductor elements 11. As a result, current density of the test current is controlled to a desirable current density. Further, the temperature of the current application stage is adjusted, and test temperature for each of the current-carrying semiconductor elements 11 is controlled to a desirable temperature. Temperature of the current application stage is set to lower than the desirable test temperature for each of the current-carrying semiconductor elements 11 because each of the current-carrying semiconductor elements 11 generates heat when a current-carrying test is conducted. A calorific value of each of the current-carrying semiconductor elements 11 depends on a forward loss of a P-N junction diode incorporated in each of the current-carrying semiconductor elements 11 and a current value of test current. Test temperature is predicted by, for example, multiplying thermal resistance between the current application stage and a most heated part of each of the current-carrying semiconductor elements 11 by a calorific value, and then adding the obtained value to a temperature of the current application stage. Temperature of the current application stage is set to, for example, 200° C. When a current-carrying test is conducted, current is applied to a P-N junction diode incorporated in each of the current-carrying semiconductor elements 11 during a set time.

Further, when a current-carrying test is conducted, forward characteristics of a P-N junction diode before and after the current-carrying test is compared to verify a degree of bipolar degradation. Then, in a case where an amount of change in the forward characteristics of the P-N junction diode before and after the current-carrying test is out of a standard, a current-carrying semiconductor elements 11 having the P-N junction diode built-in is excluded from shipping targets.

In step S8, as illustrated in FIG. 3, the two or more source electrodes 16 are electrically connected to each other via the source circuit pattern 22. Thus, a common source potential is applied to the two or more source electrodes 16. In the first preferred embodiment, each of the two or more source electrodes 16 is electrically connected to each of the two or more first source pads 22-1 via each of two or more conductive wires 36, by which the two or more source electrodes 16 are electrically connected to each other via the source circuit pattern 22.

In step S9, as illustrated in FIG. 3, two or more gate electrodes 15 are electrically reconnected to each other via the gate circuit pattern 21. In the first preferred embodiment, each of the two or more gate electrodes 15 is electrically reconnected to each of the two or more first gate pads 21-1 via each of another two or more conductive wires 37, by which the two or more gate electrodes 15 are electrically reconnected to each other via the gate circuit pattern 21. Thus, the conductive wires 37 can ensure long-time reliability and conductivity even in a case where long-time reliability and conductivity of the conductive wires 35 formed before a current-carrying test are degraded in the current-carrying test. Degradation of long-time reliability and conductivity of conductive wires 35, which is formed before a current-carrying test, in a current-carrying test may be caused by a bonding surface of a conductive wire 35 and a gate electrode 15, or a bonding surface of a conductive wire 35 and a gate circuit pattern 21 being subjected to high temperature, an intermetallic compound growing on the bonding surface, and connection strength of the conductive wire 35 being degraded.

Steps S8 and S9 may or may not be performed simultaneously. Steps S8 and S9 may be performed in any order.

By performing steps S1 to S9, it is possible to obtain a second intermediate product 1B of the semiconductor device 1 including the plurality of current-carrying semiconductor elements 11, the relay board 12, the two or more gate electrodes 15, the two or more source electrodes 16, the conductor plate 31, the conductor pieces 32, the conductive wires 35, the conductive wires 36, and the conductive wires 37, which are illustrated in FIG. 3.

In step S10, as illustrated in FIGS. 4 and 5, a plurality of spacer conductors 33 is connected to the gate circuit pattern 21 and the source circuit pattern 22. In the first preferred embodiment, the plurality of spacer conductors 33 includes a spacer conductor connected to the second gate pad 21-2 and a spacer conductor connected to the second source pad 22-2. The plurality of spacer conductors 33 preferably has a thickness comparable to a thickness of the conductor pieces 32.

Step S10 may be performed either before or after steps S8 and S9 are performed. Step S10 may be performed before step S7 is performed.

In step S11, resin sealing material 41 is formed as illustrated in FIGS. 4 and 5. The resin sealing material 41 covers the current-carrying semiconductor elements 11, the relay board 12, at least a portion of the conductor plate 31, at least a portion of the conductor pieces 32, and at least a portion of the plurality of spacer conductors 33.

In step S12, as illustrated in FIGS. 4 and 5, at least a portion of the resin sealing material 41, at least a portion of the conductor pieces 32, and at least a portion of the plurality of spacer conductors 33 are ground. Thus, a surface of each of the conductor pieces 32 and a surface of each of the plurality of spacer conductors 33 are exposed on a ground surface of the resin sealing material 41. A portion of the conductor plate 31 may be ground.

In the method for manufacturing a semiconductor device according to the first preferred embodiment, step S7 is performed after steps S1 to S6 are performed. Further, steps S8 to S12 are performed after S7 is performed.

By performing steps S1 to S12, it is possible to obtain a semiconductor device 1 including the plurality of current-carrying semiconductor elements 11, the relay board 12, the two or more gate electrodes 15, the two or more source electrodes 16, the conductor plate 31, the conductor pieces 32, the plurality of spacer conductors 33, the conductive wires 35, the conductive wires 36, the conductive wires 37, and the resin sealing material 41, which are illustrated in FIGS. 4 and 5. On the semiconductor device 1, a high temperature reverse bias (HTRB) test and a test such as a switching test are conducted. In the switching test, voltage corresponding to withstand voltage of the semiconductor device 1 is applied to the semiconductor device 1.

1.2 Method for Manufacturing Power Control Circuit

A method for manufacturing the power control circuit according to the first preferred embodiment includes steps S1 to S13 illustrated in FIG. 6.

In manufacturing of a power control circuit, a plurality of semiconductor devices 1 is manufactured by the method for manufacturing a semiconductor device according to the first preferred embodiment including steps S1 to S12.

In step S13, a power control circuit including the manufactured plurality of semiconductor devices 1 is manufactured. The manufactured power control circuit constitutes a semiconductor device having a circuit configuration larger than a circuit configuration of each of the semiconductor devices 1.

In a case where an equivalent circuit of the semiconductor device 1 includes one phase of MOSFET, a semiconductor device including a half-bridge circuit can be manufactured by mounting two semiconductor devices 1 on an insulating substrate with circuit pattern. In addition, a semiconductor device including a full-bridge circuit can be manufactured by mounting six semiconductor devices 1 on an insulating substrate with circuit pattern. Further, a semiconductor device including a step-up circuit, or the like, can be manufactured with a combination of a half-bridge circuit, a full-bridge circuit, or the like. After the semiconductor device 1 is mounted on the insulating substrate with circuit pattern, a signal electrode, a main current electrode, or the like, is bonded to the semiconductor device 1. The semiconductor device 1 and the insulating substrate with circuit pattern may be covered with sealing material. A pre-shipping inspection is conducted on the semiconductor device including the power control circuit. In the pre-shipping inspection, reduction or omission of screening test time is possible. This is because the screening test has already been conducted when the semiconductor device 1 is manufactured.

1.3 Effects of First Preferred Embodiment

According to the first preferred embodiment, a current-carrying test is conducted, not on a single current-carrying semiconductor element 11, but on the plurality of P-N junction diodes of the first intermediate product 1A in the semiconductor device 1 including the plurality of current-carrying semiconductor elements 11. Thus, a current-carrying test is conducted on a plurality of P-N junction diodes with the P-N junction diodes included in the first intermediate product 1A of the semiconductor device 1. Therefore, it is possible to conduct screening tests for a plurality of current-carrying semiconductor elements 11 simultaneously. As a result, productivity of the semiconductor device 1 can be improved.

Further, according to the first preferred embodiment, a current-carrying test is conducted, not on a semiconductor device including a power control circuit, but on the plurality of P-N junction diodes of the first intermediate product 1A in the semiconductor device 1 including the plurality of current-carrying semiconductor elements 11. Thus, the number of the current-carrying semiconductor elements 11 simultaneously subjected to a current-carrying test can be reduced. As a result, a decrease in yield in a current-carrying test can be reduced. For example, in a case where a semiconductor device including a half-bridge circuit is manufactured with an equivalent circuit of the semiconductor device 1 including one phase of MOSFET, the number of the current-carrying semiconductor elements 11 to be simultaneously subjected to a current-carrying test can be halved. In a case where a semiconductor device including a full-bridge circuit is manufactured with an equivalent circuit of the semiconductor device 1 including one phase of MOSFET, the number of the current-carrying semiconductor elements 11 to be simultaneously subjected to a current-carrying test can be reduced to one-sixth. Further, in a case where an equivalent circuit of the semiconductor device 1 includes one phase of MOSFET, it is not necessary to provide insulation to a back surface 1*b* of the semiconductor device 1. Therefore, the semiconductor device 1 can be handled easily. In addition, a current carrying apparatus for a current-carrying test can be miniaturized.

Further, according to the first preferred embodiment, the conductor pieces 32 are connected to the front surface 11*f* of the current-carrying semiconductor element 11. Thus, a test probe used for a current-carrying test can be applied to a conductor piece 32. Therefore, it is possible to reduce damage by the test probe to a surface electrode of a current-carrying semiconductor element 11. In addition, the conductor pieces 32 can be utilized as metal film for electrode bonding in a later assembly process. As a result, a cushioning material such as metal foil exclusively for protecting the surface electrode of the current-carrying semiconductor element 11 is unnecessary, by which a cost for the semiconductor device 1 can be reduced. Further, it is possible to select a test probe regardless of a damage to a surface electrode of a current-carrying semiconductor element 11. As a result, it is possible to select a test probe including a simple pin having a high current-carrying capacity. Further, according to the first preferred embodiment, a conductor piece 32 is connected to a source electrode 16 of the current-carrying semiconductor element 11. Thus, current can be applied by using an electrode having a large cross-sectional area and a small resistance component in a surface direction. As a result, even with a small number of probing points, current can be uniformly passed through the current-carrying semiconductor element 11. Further, even in a case where contact resistance is generated at a probing point and heat is generated due to the contact resistance when current is applied, the generated heat spreads inside the conductor piece 32 until the heat is transferred to the current-carrying semiconductor element 11. Thus, generation of a hot-spot in the current-carrying semiconductor element 11 can be reduced.

Further, according to the first preferred embodiment, heat generated by the current-carrying semiconductor element 11 in a current-carrying test is absorbed by the conductor plate 31, and is effectively released to a test stage, or the like, from the second principal surface 31*b* of the conductor plate 31 exposed on a bottom surface 1Ab of the first intermediate product 1A of the semiconductor device 1. As a result, it is possible to reduce an increase in temperature of the current-carrying semiconductor element 11 when a current-carrying test is conducted.

According to the first preferred embodiment, a common gate potential is applied to each of the two or more gate electrodes 15 formed on a front surface 11*f* of each of the two or more current-carrying semiconductor elements 11. Thus, the number of probing points for controlling gate bias can be reduced. Thus, a condition of a current-carrying test can be easily controlled. Thus, a pad size of the current-carrying semiconductor element 11 can be reduced, and an invalid region of the current-carrying semiconductor element 11 can be reduced. As a result, more current-carrying semiconductor elements 11 can be taken from each wafer.

When a current-carrying test is conducted, it is not possible to control each of test currents flowing through each of the two or more current-carrying semiconductor elements 11 independently in a case where a common gate potential is applied to the two or more current-carrying semiconductor elements 11, a common source potential is applied to the two or more current-carrying semiconductor elements 11, and a common drain potential is applied to the two or more current-carrying semiconductor elements 11. A ratio of each of the test currents is approximately equal to a ratio of each of reciprocals of forward voltages of the plurality of P-N junction diodes included in the two or more current-carrying semiconductor elements 11. Therefore, the test current varies according to a variation in a characteristic of the two or more current-carrying semiconductor elements 11. Therefore, the test current cannot be uniformed. Therefore, excessive current flows through a specific current-carrying semiconductor element 11. Therefore, yield in a current-carrying test decreases.

Meanwhile, as in the first preferred embodiment, when a current-carrying test is conducted, it is possible to independently control each of test currents flowing through each of the two or more current-carrying semiconductor elements 11 in a case where a common gate potential is applied to the two or more current-carrying semiconductor elements 11, source potentials independent of each other is applied to each of the two or more current-carrying semiconductor elements 11, and a common drain potential is applied to the two or more current-carrying semiconductor elements 11. Further, test current can be uniformed. For example, by supplying each of test currents, which flow through each of two or more current-carrying semiconductor elements 11, from each of two or more constant current sources of the same number as the number of the two or more current-carrying semiconductor elements 11, each of the test currents can be independently controlled when a current-carrying test is conducted, by which the test currents can be uniformed when a current-carrying test is conducted. Therefore, even in a case where characteristics of the two or more current-carrying semiconductor elements 11 are different from each other, test current can be uniformed. Therefore, yield in the current-carrying test increases.

In a case where test currents flowing through the two or more current-carrying semiconductor elements 11 cannot be controlled independently, test currents are usually varied more than test currents that flow through the two or more current-carrying semiconductor elements 11 in actual use. Thus, a decrease in yield in a current-carrying test due to failure to uniformize test currents is excessive. This point will be described.

Test current that flows through each of the current-carrying semiconductor elements 11 when a current-carrying test is conducted mainly includes a direct current component. Therefore, a current value of the test current mainly depends on a resistance component in a forward direction of impedance of each of the current-carrying semiconductor elements 11. Meanwhile, current that flows through each of the current-carrying semiconductor elements 11 in actual use includes a direct current component and an alternating current component. This is because a current value of the current often changes with time. Therefore, a current value of the current depends not only on a resistance component of the impedance but also on an inductance component of the impedance. Therefore, the current value of the current is relatively not affected by the forward voltage characteristic of each of the current-carrying semiconductor elements 11. In particular, in a semiconductor device that uses a synchronous rectification method to apply current to an incorporated P-N junction diode for a very short time during a dead time period, a direct current component included in current flowing through each of the current-carrying semiconductor elements in actual use. Therefore, the current value is not easily affected by a forward voltage characteristic of each of the current-carrying semiconductor elements 11. Therefore, test currents are usually varied more than each of test currents that flow through each of the two or more current-carrying semiconductor elements 11 in actual use.

Further, according to the first preferred embodiment, after a current-carrying test, a common gate potential is applied to the two or more current-carrying semiconductor elements 11, a common source potential is applied to the two or more current-carrying semiconductor elements 11, and a common drain potential is applied to the two or more current-carrying semiconductor elements 11. This is because it is not necessary to control each of test currents flowing through each of the two or more current-carrying semiconductor elements 11 independently after the current-carrying test. Thus, two or more current-carrying semiconductor elements 11 can be controlled as a single current-carrying power generation element.

According to the first preferred embodiment, a back surface 11*b* of each of the plurality of current-carrying semiconductor elements 11 is connected to the first principal surface 31*f* of the conductor plate 31 by sinter bonding. Further, a conductor piece 32 is connected to a front surface 11*f* of each of the plurality of current-carrying semiconductor elements 11 by sinter bonding. In addition, the relay board 12 is connected to the first principal surface 31*f* of the conductor plate 31 by sinter bonding. Thus, deterioration of a bonding surface can be reduced even in a case where the first intermediate product 1A of the semiconductor device 1 is exposed to a high temperature when a current-carrying test is conducted in order to reduce time during which the current-carrying test is conducted. As a result, it is possible to manufacture a semiconductor device 1 having high reliability.

Further, according to the first preferred embodiment, two or more gate electrodes 15 are reconnected to the gate circuit pattern 21 after a current-carrying test. Thus, a semiconductor device 1 having high reliability can be manufactured even in a case where, when a current-carrying test is conducted, a first intermediate product 1A of the semiconductor device 1 is exposed to a high temperature in order to reduce time during which the current-carrying test is conducted, by which long-time reliability and conductivity of a conductive wires 35 are degraded.

Further, according to the first preferred embodiment, resin sealing material 41 is formed after the current-carrying test. Thus, deterioration of the resin sealing material 41 can be reduced, and a reduction in weight of the resin sealing material 41 can be prevented even in a case where the first intermediate product 1A of the semiconductor device 1 is exposed to a high temperature when a current-carrying test is conducted in order to reduce time during which the current-carrying test is conducted. In a case where resin sealing material 41 is formed after a current-carrying test is conducted, there is no resin sealing material 41 when the current-carrying test is conducted. However, creeping discharge may not be generated in the current-carrying semiconductor element 11 even in a case where there is no resin sealing material 41, because high voltage is not applied when a current-carrying test is conducted on a P-N junction diode. Therefore, it is possible to set test temperature of a current-carrying semiconductor element 11 subjected to a current-carrying test to a test temperature suitable for reducing the time during which the current-carrying test is conducted.

Further, according to the first preferred embodiment, at least a portion of a conductor piece 32 is ground after the current-carrying test is conducted. As a result, oxide film formed on a surface of at least a portion of the conductor piece 32 when the current-carrying test is conducted is removed. As a result, it is possible to restore current-carrying capacity of at least a portion of the conductor piece 32 and bondability with a connecting material such as soldering.

Further, in a case where step S10 is performed before step S7 is performed in the first preferred embodiment, it is possible to restore current-carrying capacity of at least a portion of a plurality of spacer conductors 33 and bondability with a connecting material such as soldering, by at least a portion of each of a plurality of spacer conductors 33 being ground and a surface of each of the plurality of spacer conductors 33 being exposed on a ground surface of resin sealing material 41 after the current-carrying test is conducted.

Further, according to the first preferred embodiment, a screening test has already been conducted when the semiconductor device 1 is manufactured. As a result, it is possible to reduce time required for a pre-shipping inspection of a semiconductor device including a power control circuit. In addition, yield in the pre-shipping inspection can be increased. Because inspection equipment for pre-shipping inspection is often large in size and costly, capability of reducing time required for a pre-shipping inspection may be economically beneficial. Further, because a semiconductor device having a large circuit configuration includes many members, the semiconductor device may incur a large amount of loss cost if determined to be defective. Therefore, capability of increasing yield in pre-shipping inspection may contribute to reducing the loss cost.

2 Second Preferred Embodiment

Figure 7:
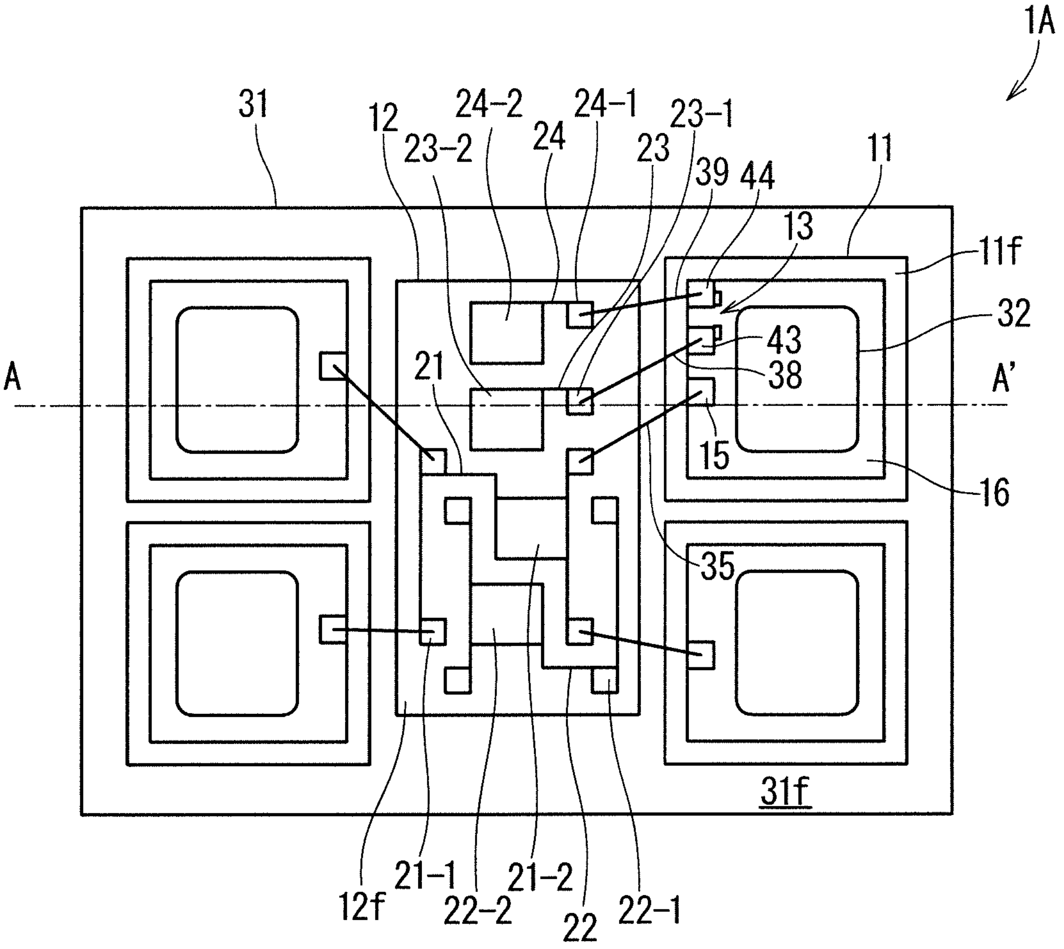
FIG. 7 is a plan view schematically illustrating a first intermediate product of a semiconductor device manufactured by a method for manufacturing a semiconductor device according to a second preferred embodiment.

FIG. 7 is a plan view schematically illustrating a first intermediate product of a semiconductor device manufactured by a method for manufacturing a semiconductor device according to a second preferred embodiment.

Figure 8:
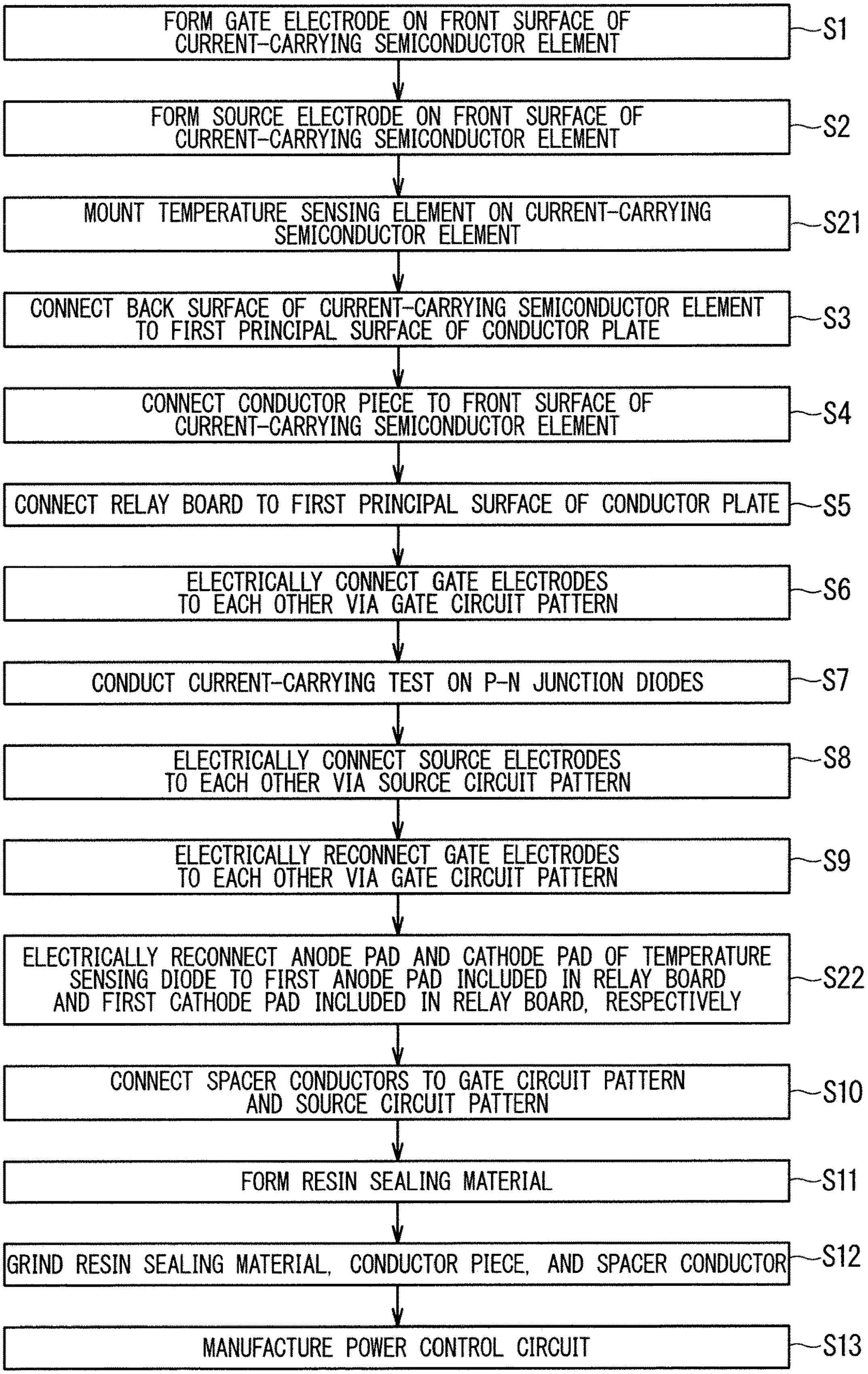
FIG. 8 is a flowchart illustrating a method for manufacturing a semiconductor device and method for manufacturing a power control circuit according to the second preferred embodiment.

FIG. 8 is a flowchart illustrating a method for manufacturing a semiconductor device and method for manufacturing a power control circuit according to the second preferred embodiment.

The method for manufacturing a semiconductor device and method for manufacturing a power control circuit according to the second preferred embodiment are different from the method for manufacturing a semiconductor device and method for manufacturing a power control circuit according to the first preferred embodiment mainly in the points described below. For points not described below, a configuration similar to a configuration adopted for the method for manufacturing a semiconductor device and method for manufacturing the power control circuit according to the first preferred embodiment are adopted for the method for manufacturing a semiconductor device and method for manufacturing the power control circuit according to the second preferred embodiment.

The method for manufacturing a semiconductor device according to the second preferred embodiment includes steps S1 to S12, S21, and S22 illustrated in FIG. 8.

In step S21, as illustrated in FIG. 7, a temperature sensing element 13 is mounted on a current-carrying semiconductor element 11 included in each of the plurality of current-carrying semiconductor elements 11. The temperature sensing element 13 includes a temperature sensing diode, or the like. In a case where the temperature sensing element 13 includes a temperature sensing diode, an anode pad 43 of the temperature sensing diode is electrically connected to a first anode pad 23-1 included in a relay board 12 via a conductive wire 38, and a cathode pad 44 of the temperature sensing diode is electrically connected to a first cathode pad 24-1 via a conductive wire 39. The first anode pad 23-1 is connected to a second anode pad 23-2 included in the relay board 12 via an anode circuit pattern 23, and the first cathode pad 24-1 is connected to a second cathode pad 24-2 included in the relay board 12 via a cathode circuit pattern 24. As a result, a potential of the temperature sensing diode can be acquired by electrically probing the second anode pad 23-2 and the second cathode pad 24-2. For example, temperature of a current-carrying semiconductor element 11 when a current-carrying test is conducted can be measured by applying a small current for temperature check through the temperature sensing diode and reading forward voltage of the temperature sensing diode. In the second preferred embodiment, the temperature sensing element 13 is mounted on one current-carrying semiconductor element 11. As a result, the semiconductor device 1 can be miniaturized as compared with a case where a temperature sensing element 13 is mounted on each of the two or more current-carrying semiconductor elements 11. For example, a current-carrying semiconductor element 11 on which a temperature sensing element 13 is mounted and current-carrying semiconductor element 11 on which a temperature sensing element 13 is not mounted may be electrically connected in parallel to constitute a semiconductor device 1. As a result, a manufacturing cost of the current-carrying semiconductor element 11 can be reduced.

In step S7, it is desirable to add a temperature sensed by the temperature sensing element 13 to a value obtained by multiplying thermal resistance between the current-carrying semiconductor element 11 and the temperature sensing element 13 by a calorific value, by which temperature of the current-carrying semiconductor element 11 can be predicted more accurately than in the first preferred embodiment. This is because the thermal resistance between the current-carrying semiconductor element 11 and the temperature sensing element 13 is smaller than thermal resistance between a current application stage and a most heated part of each of the current-carrying semiconductor elements 11, by which prediction error is small.

In step S22, the anode pad 43 and cathode pad 44 of the temperature sensing diode are electrically reconnected by another conductive wire to the first anode pad 23-1 and first cathode pad 24-1, respectively. The first anode pad 23-1 and first cathode pad 24-1 are included in the relay board 12. Thus, an another conductive wire can ensure long-time reliability and conductivity even in a case where long-time reliability and conductivity of the conductive wire 38 or conductive wire 39 formed before a current-carrying test are degraded in the current-carrying test.

Step S22 may or may not be performed simultaneously with steps S8 and S9.

Step S22 is performed after step S7.

3 Third Preferred Embodiment

Figure 9:
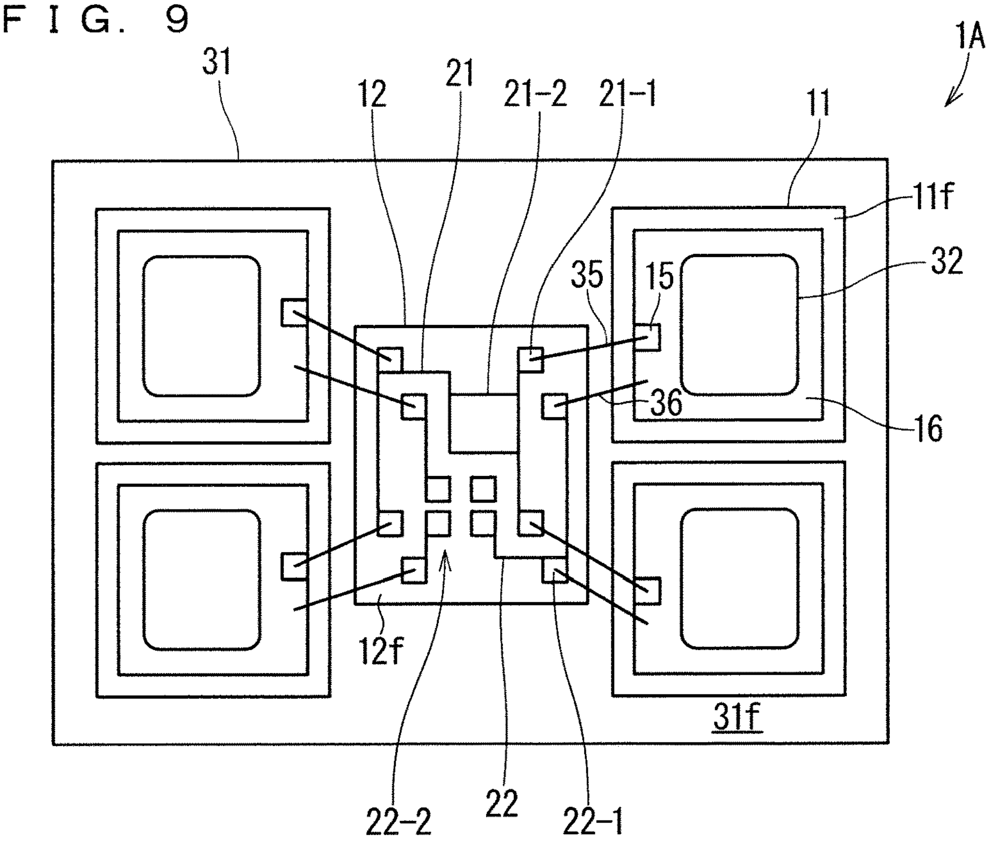
FIG. 9 is a plan view schematically illustrating a first intermediate product of a semiconductor device manufactured by a method for manufacturing a semiconductor device according to a third preferred embodiment.
Figure 10:
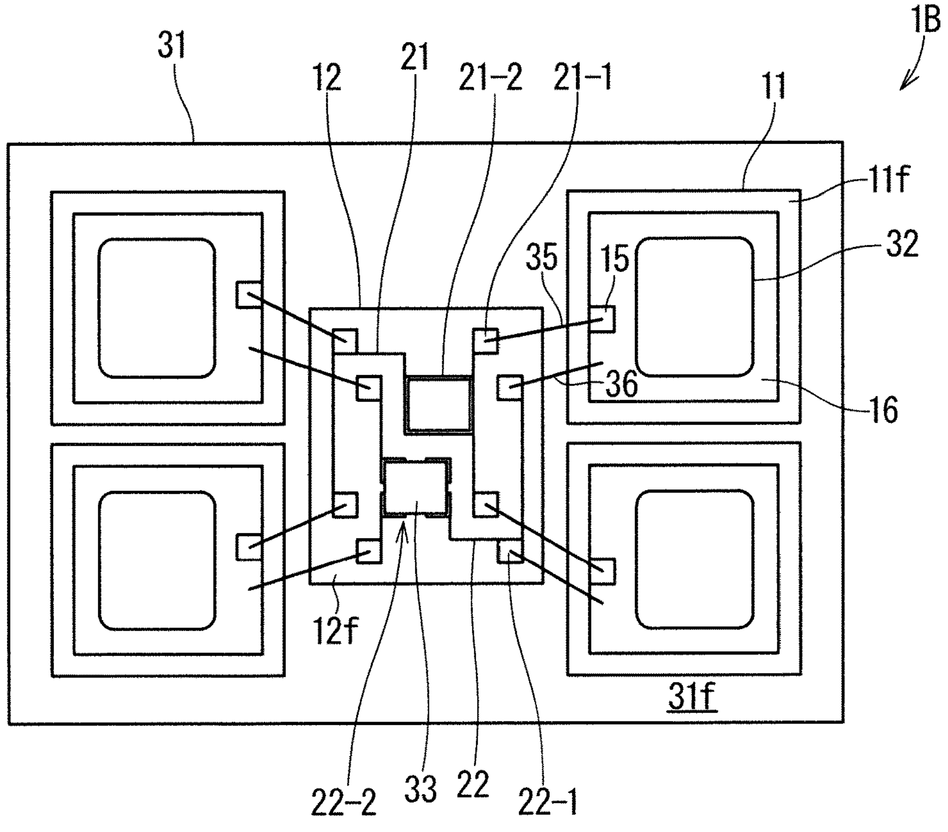
FIG. 10 is a plan view schematically illustrating a second intermediate product of the semiconductor device manufactured by the method for manufacturing a semiconductor device according to the third preferred embodiment.

FIG. 9 is a plan view schematically illustrating a first intermediate product of the semiconductor device manufactured by a method for manufacturing a semiconductor device according to a third preferred embodiment. FIG. 10 is a plan view schematically illustrating a second intermediate product of the semiconductor device manufactured by the method for manufacturing a semiconductor device according to the third preferred embodiment.

Figure 11:
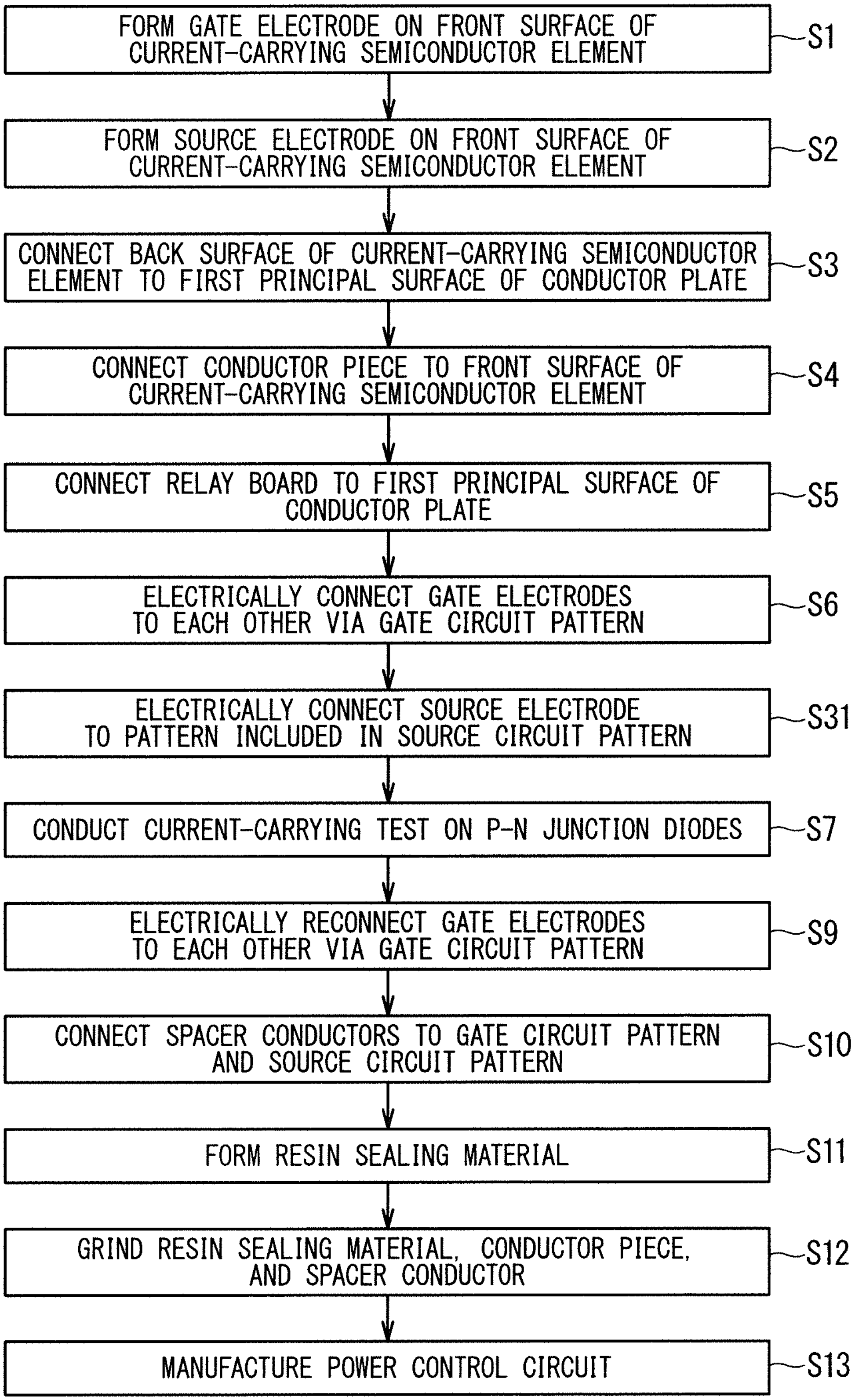
FIG. 11 is a flowchart illustrating a method for manufacturing a semiconductor device and method for manufacturing a power control circuit according to the third preferred embodiment.

FIG. 11 is a flowchart illustrating the method for manufacturing a semiconductor device and method for manufacturing a power control circuit according to the third preferred embodiment.

The method for manufacturing a semiconductor device and method for manufacturing a power control circuit according to the third preferred embodiment are different from the method for manufacturing a semiconductor device and method for manufacturing a power control circuit according to the first preferred embodiment mainly in the points described below. For points not described below, a configuration similar to a configuration adopted for the method for manufacturing a semiconductor device and method for manufacturing the power control circuit according to the first preferred embodiment is adopted for the method for manufacturing a semiconductor device and method for manufacturing the power control circuit according to the third preferred embodiment.

The method for manufacturing a semiconductor device according to the third preferred embodiment includes steps S1 to S7, S9 to S13, and S31, which are illustrated in FIG. 11.

In a relay board 12 connected a the first principal surface **31*f* of a conductor plate 31 in step S5, a second source pad 22-2 is divided two or more second source pads as illustrated in FIG. 9. Each of the two or more second source pads 22-2 is electrically connected to each of two or more first source pads 22-1. For this reason, the source circuit pattern 22** includes two or more patterns electrically independent of each other.

Further, in the relay board 12 connected to the first principal surface **31*f* of the conductor plate 31 in step S5, bonding film is provided on a surface of the second gate pad 21-2 and a surface of each of two or more second source pads 22-2**. The bonding film is film capable of bonding such as solder bonding and sinter bonding. Plating film, or the like, in which NiP film, Pd film, and Au film are laminated in order, can be used as the bonding film.

In step S31, as illustrated in FIG. 9, each of two or more source electrodes 16 is electrically connected to each of two or more patterns included in the source circuit pattern 22. In the third preferred embodiment, each of the two or more source electrodes 16 is electrically connected to each of the two or more first source pads 22-1 via each of two or more conductive wires 36, by which each of the two or more source electrodes 16 is electrically connected to each of the two or more patterns. In a first intermediate product 1A illustrated in FIG. 9, the two or more patterns are electrically independent of each other, and therefore, each of source potentials independent of each other can be applied to each of the two or more source electrodes 16 even in a case where each of the two or more source electrodes 16 is electrically connected to each of two or more patterns. Step S31 is performed before step S7 is performed.

A spacer conductor 33 connected to the source circuit pattern 22 in step S10 electrically connects two or more patterns included in the source circuit pattern 22 to each other. Thus, a common source potential is applied to the two or more source electrodes 16. In the third preferred embodiment, the spacer conductor 33 connected to the source circuit pattern 22 is connected to a connection region for the spacer conductor 33, which extends over two or more second source pads 22-2. Thus, the two or more patterns included in the source circuit pattern 22 are electrically connected to each other, and a plurality of current-carrying semiconductor elements 11 can be electrically connected in parallel. Step S10 is performed after step S7.

A spacer conductor 33 connected to a second gate pad 21-2 in step S10 is bonded to bonding film provided on a surface of the second gate pad 21-2. Further, the spacer conductor 33 connected to the two or more second source pads 22-2 is bonded to bonding film provided on a surface of the two or more second source pads 22-2.

Bonding film including the above-described plating film may be provided on a surface of a gate electrode 15 formed in step S1 and on a source electrode 16 formed in step S2. In a case where the bonding film is provided on a surface of a gate electrode 15, a conductive wire 35 is bonded to the bonding film provided on the surface of the gate electrode 15 in step S6. Further, in step S31, a conductive wire 36 is bonded to bonding film provided on a surface of a source electrode 16.

According to the third preferred embodiment, even in a case where the two or more source electrodes 16 are electrically connected to the source circuit pattern 22, each of two or more source potentials independent of each other is electrically applied to each of two or more current-carrying semiconductor elements 11. Thus, it is possible to independently control each of test currents flowing through the two or more current-carrying semiconductor elements 11 when a current-carrying test is conducted. Further, test current can be uniformed. Therefore, even in a case where characteristics of the two or more current-carrying semiconductor elements 11 are different from each other, test current can be uniformed. Therefore, yield in the current-carrying test increases.

Further, according to the third preferred embodiment, it is not necessary to electrically connect each of the two or more source electrodes 16 to each of two or more first source pads 22-1 with each of the two or more conductive wires 36 after a current-carrying test. As a result, productivity of the semiconductor device 1 can be improved.

Further, in a case where the bonding film including the above-described plating film is provided on a surface of a source electrode 16 in the third preferred embodiment, it is possible to reduce oxidation of a surface of the bonding film due to a temperature increase in a current-carrying test conducted in step S7 and welling up of Ni, which is included in film of a lower layer, on Au film by the heating. As a result, it is possible to reduce connection failure of a conductor piece 32 in a case where the conductor piece 32 is connected to a source electrode 16 after a current-carrying test. Therefore, step S4 can be performed after step S7.

Further, in the third preferred embodiment, it is not necessary to electrically reconnect each of two or more source electrodes 16 to each of the two or more first source pads 22-1 with each of the two or more conductive wires 36 after a current-carrying test in a case where heat stress due to an increase in temperature during the current-carrying test conducted in step S7 is reduced to a degree where a bonding surface of a conductive wire 36 and first source pad 22-1 does not deteriorate. Further, in a case where the heat stress is reduced to a degree where a bonding surface of a conductive wire 35 and first gate pad 21-1 does not deteriorate, it is possible to omit step S9, similarly, in which two or more gate electrodes 15 are electrically reconnected to each other via a gate circuit pattern 21.

The respective preferred embodiments can be freely combined, or the respective preferred embodiments can be appropriately modified or omitted.

While the present disclosure has been described in detail, the foregoing description is in all aspects illustrative and not restrictive. It is therefore understood that numerous modifications and variations not illustrated can be devised.

While the disclosure has been shown and described in detail, the foregoing description is in all aspects illustrative and not restrictive. It is therefore understood that numerous modifications and variations can be devised.

What is claimed is:

1. A method for manufacturing a semiconductor device, the method comprising:
- a) connecting a back surface of each of a plurality of current-carrying semiconductor elements having each of a plurality of P-N junction diodes built-in to a first principal surface of a conductor plate;
- b) connecting a conductor piece on a front surface of each of the plurality of current-carrying semiconductor elements; and
- c) conducting, after step a) and step b) are performed, a current-carrying test of the plurality of P-N junction diodes by applying a common potential to each of the plurality of current-carrying semiconductor elements via a second principal surface of the conductor plate with the second principal surface of the conductor plate exposed on a bottom surface of an intermediate product of a semiconductor device including the plurality of current-carrying semiconductor elements, the conductor plate, and the conductor piece,
- wherein during step c), the second principal surface of the conductor plate is electrically connected to the plurality of current-carrying semiconductor elements.

2. The method for manufacturing a semiconductor device according to claim 1, the method further comprising:
- d) forming each of two or more gate electrodes on a front surface of each of two or more current-carrying semiconductor elements included in the plurality of current-carrying semiconductor elements;
- e) connecting a relay board including a gate circuit pattern having conductivity to the first principal surface; and
- f) electrically connecting the two or more gate electrodes to each other via the gate circuit pattern,
- wherein step c) is performed after step d), step e), step f) are performed.

3. The method for manufacturing a semiconductor device according to claim 2, wherein, in step e), the relay board is connected to the first principal surface by sinter bonding.

4. A method for manufacturing a semiconductor device, the method comprising:
- a) connecting a back surface of each of a plurality of current-carrying semiconductor elements having each of a plurality of P-N junction diodes built-in to a first principal surface of a conductor plate;
- b) connecting a conductor piece on a front surface of each of the plurality of current-carrying semiconductor elements;
- c) conducting, after step a) and step b) are performed, a current-carrying test of the plurality of P-N junction diodes with a second principal surface of the conductor plate exposed on a bottom surface of an intermediate product of a semiconductor device including the plurality of current-carrying semiconductor elements, the conductor plate, and the conductor piece;
- d) forming each of two or more gate electrodes on a front surface of each of two or more current-carrying semiconductor elements included in the plurality of current-carrying semiconductor elements;
- e) connecting a relay board including a gate circuit pattern having conductivity to the first principal surface;
- f) electrically connecting the two or more gate electrodes to each other via the gate circuit pattern; and
- g) electrically reconnecting the two or more gate electrodes to each other via the gate circuit pattern after step c) is performed,
- wherein step c) is performed after step d), step e), step f) are performed.

5. A method for manufacturing a semiconductor device, the method comprising:
- a) connecting a back surface of each of a plurality of current-carrying semiconductor elements having each of a plurality of P-N junction diodes built-in to a first principal surface of a conductor plate;
- b) connecting a conductor piece on a front surface of each of the plurality of current-carrying semiconductor elements;
- c) conducting, after step a) and step b) are performed, a current-carrying test of the plurality of P-N junction diodes by applying a common potential to each of the plurality of current-carrying semiconductor elements via a second principal surface of the conductor plate with the second principal surface of the conductor plate exposed on a bottom surface of an intermediate product of a semiconductor device including the plurality of current-carrying semiconductor elements, the conductor plate, and the conductor piece;
- h) forming each of two or more source electrodes on a front surface of each of two or more current-carrying semiconductor elements included in the plurality of current-carrying semiconductor elements;
- i) connecting a relay board including a source circuit pattern having conductivity to the first principal surface; and
- j) electrically connecting the two or more source electrodes to each other via the source circuit pattern,
- wherein step j) is performed after step c) is performed, and
- during step c), the second principal surface of the conductor plate is electrically connected to the plurality of current-carrying semiconductor elements.

6. The method for manufacturing a semiconductor device according to claim 5, wherein, in step i), the relay board is connected to the first principal surface by sinter bonding.

7. The method for manufacturing a semiconductor device according to claim 1, the method further comprising:

k) forming each of two or more source electrodes on a front surface of each of two or more current-carrying semiconductor elements included in the plurality of current-carrying semiconductor elements;

l) connecting a relay board including a source circuit pattern including two or more patterns electrically independent of each other and having conductivity to the first principal surface; and m) electrically connecting each of the two or more source electrodes to each of the two or more patterns, wherein step m) is performed before step c) is performed.

8. The method for manufacturing a semiconductor device according to claim 7, the method further comprising:

n) connecting a spacer conductor electrically connecting the two or more patterns to each other to the source circuit pattern, wherein step n) is performed after step c) is performed.

9. The method for manufacturing a semiconductor device according to claim 1, wherein in step a), a back surface of each of the plurality of current-carrying semiconductor elements is connected to the first principal surface by sinter bonding, and in step b), the conductor piece is connected to a front surface of each of the plurality of current-carrying semiconductor elements by sinter bonding.

10. The method for manufacturing a semiconductor device according to claim 1, wherein the conductor piece is a plurality of conductor pieces independent of each other and connected to a front surface of each of the plurality of current-carrying semiconductor elements, the method further comprises:

o) forming each of two or more source electrodes on a front surface of each of two or more current-carrying semiconductor elements included in the plurality of current-carrying semiconductor elements, wherein, in step b), each of two or more conductor pieces included in the plurality of conductor pieces is connected to a front surface of each of the two or more current-carrying semiconductor elements via each of the two or more source electrodes.

11. A method for manufacturing a semiconductor device, the method comprising:

a) connecting a back surface of each of a plurality of current-carrying semiconductor elements having each of a plurality of P-N junction diodes built-in to a first principal surface of a conductor plate;

b) connecting a conductor piece on a front surface of each of the plurality of current-carrying semiconductor elements;

c) conducting, after step a) and step b) are performed, a current-carrying test of the plurality of P-N junction diodes by applying a common potential to each of the plurality of current-carrying semiconductor elements via a second principal surface of the conductor plate with the second principal surface of the conductor plate exposed on a bottom surface of an intermediate product of a semiconductor device including the plurality of current-carrying semiconductor elements, the conductor plate, and the conductor piece;

p) connecting a relay board including a gate circuit pattern having conductivity and a source circuit pattern having conductivity to the first principal surface;

q) connecting a plurality of spacer conductors to the gate circuit pattern and the source circuit pattern; and r) forming, after step c) is performed, resin sealing material covering the plurality of current-carrying semiconductor elements, the relay board, at least a portion of the conductor plate, at least a portion of the conductor piece, and at least a portion of the plurality of spacer conductors, wherein during step c), the second principal surface of the conductor plate is electrically connected to the plurality of current-carrying semiconductor elements.

12. The method for manufacturing a semiconductor device according to claim 11, the method further comprising:

s) grinding at least a portion of the conductor piece, at least a portion of the plurality of spacer conductors, and at least a portion of the resin sealing material, and exposing a surface of the conductor piece and a surface of the spacer conductor on a ground surface of the resin sealing material.

13. The method for manufacturing a semiconductor device according to claim 1, the method further comprising:

t) mounting a temperature sensing element on a current-carrying semiconductor element included in the plurality of current-carrying semiconductor elements.

14. A method for manufacturing a power control circuit comprising:

manufacturing a plurality of semiconductor devices by the method for manufacturing a semiconductor device according to claim 1; and manufacturing a power control circuit including the plurality of semiconductor devices.

15. The method for manufacturing a semiconductor device according to claim 1, wherein the conductor piece is included among a plurality of conductor pieces connected on the front surface of each of the plurality of current-carrying semiconductor elements, and at least two conductor pieces among the plurality of conductor pieces have different potentials from each other during the current-carrying test.

16. The method for manufacturing a semiconductor device according to claim 1, the method further comprising:

u) forming, after step c) is performed, resin sealing material covering the plurality of current-carrying semiconductor elements, at least a portion of the conductor plate, and at least a portion of the conductor piece; and v) grinding at least a portion of the conductor piece and at least a portion of the resin sealing material.

* * * * *